(12) United States Patent
Kim et al.

(10) Patent No.: US 10,650,746 B2
(45) Date of Patent: May 12, 2020

(54) ORGANIC LIGHT EMITTING DISPLAY

(71) Applicant: LG Display Co., Ltd., Seoul (KR)

(72) Inventors: Yong-Min Kim, Paju-si (KR); Woo-Chan Cho, Paju-si (KR); Eun-Young Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 88 days.

(21) Appl. No.: 15/803,226

(22) Filed: Nov. 3, 2017

(65) Prior Publication Data

US 2018/0151120 A1    May 31, 2018

(30) Foreign Application Priority Data

Nov. 30, 2016 (KR) ......................... 10-2016-0161363

(51) Int. Cl.
| | |
|---|---|
| *H01L 27/32* | (2006.01) |
| *G09G 3/3258* | (2016.01) |
| *G09G 3/3291* | (2016.01) |
| *H01L 33/60* | (2010.01) |
| *H01L 51/00* | (2006.01) |
| *H01L 51/52* | (2006.01) |

(52) U.S. Cl.
CPC ......... *G09G 3/3258* (2013.01); *G09G 3/3291* (2013.01); *H01L 27/3244* (2013.01); *H01L 27/3262* (2013.01); *H01L 27/3272* (2013.01); *H01L 33/60* (2013.01); *H01L 51/0097* (2013.01); *H01L 51/5237* (2013.01); *H01L 51/5271* (2013.01)

(58) Field of Classification Search
CPC ............... H01L 27/124; H01L 27/3272; H01L 27/3276; H01L 29/78621; H01L 51/5271; H01L 27/3244; H01L 27/3262; H01L 33/60; H01L 51/0097; H01L 51/5237; G06F 3/044; G02F 1/1345; G02F 1/1339; G09G 3/3258; G09G 3/3291
See application file for complete search history.

(56) References Cited

U.S. PATENT DOCUMENTS

| | | | |
|---|---|---|---|
| 9,136,315 B1 | 9/2015 | Kim et al. | |
| 2007/0210303 A1* | 9/2007 | Ikeda | ................ H01L 29/78621 257/40 |
| 2008/0290796 A1* | 11/2008 | Chan | ................... H01L 27/3272 313/504 |
| 2011/0266565 A1* | 11/2011 | Wang | ................... G02F 1/1339 257/91 |

(Continued)

OTHER PUBLICATIONS

European Patent Office, Extended European Search Report and Opinion, EP Patent Application No. 17204698.9, dated Apr. 26, 2018, nine pages.

*Primary Examiner* — Ibrahim A Khan
(74) *Attorney, Agent, or Firm* — Fenwick & West LLP

(57) ABSTRACT

Disclosed is an organic light emitting display having a mirror function. In an embodiment, a light-shielding reflective layer overlaps areas of the organic light emitting display except for emission areas provided with light emitting devices formed therein. The light-shielding reflective layer prevents light from entering channel regions of active layers and reflects external light, for example, when the organic light emitting device is not operated to display an image, and thus the organic light emitting display may stably implement a mirror function.

30 Claims, 10 Drawing Sheets

(56) References Cited

U.S. PATENT DOCUMENTS

| | | | |
|---|---|---|---|
| 2013/0077034 A1* | 3/2013 | Jung | G02F 1/1345 349/122 |
| 2013/0313672 A1* | 11/2013 | Min | G03B 11/048 257/434 |
| 2014/0077171 A1* | 3/2014 | Yamakita | G02B 5/201 257/40 |
| 2015/0009422 A1* | 1/2015 | Tung | G06F 3/044 349/12 |
| 2015/0144910 A1* | 5/2015 | Beak | H01L 27/124 257/40 |
| 2015/0187854 A1* | 7/2015 | Beak | H01L 27/3262 257/40 |
| 2015/0187856 A1* | 7/2015 | Park | H01L 27/3272 257/40 |
| 2015/0187959 A1* | 7/2015 | Yoon | H01L 27/1225 257/43 |
| 2016/0049426 A1 | 2/2016 | Lim et al. | |
| 2016/0197132 A1* | 7/2016 | Cho | H01L 27/3272 257/40 |
| 2016/0268551 A1* | 9/2016 | Shen | H01L 51/5271 |
| 2016/0284782 A1* | 9/2016 | Seo | H01L 27/3276 |
| 2018/0151120 A1* | 5/2018 | Kim | G09G 3/3258 |

\* cited by examiner

ORGANIC LIGHT EMITTING DISPLAY

CROSS REFERENCE TO RELATED APPLICATION

This application claims priority under 35 U.S.C. § 119(a) of Republic of Korea Patent Application No. 10-2016-0161363, filed on Nov. 30, 2016, which is hereby incorporated by reference in its entirety.

BACKGROUND

Technical Field

The present disclosure relates to an organic light emitting display, and more particularly, to an organic light emitting display having a mirror function.

Discussion of the Related Art

Display devices, which display various pieces of information on a screen, are a core technology in the age of information and communication and have been developed to satisfy small-thickness, light-weight, portability, and high-performance trends. Therefore, as a flat panel display which can reduce weight and volume to make up for drawbacks of a cathode ray tube (CRT), an organic light emitting display, which controls the amount of light emitted from an organic light emitting layer and thus displays an image, has been spotlighted now. Such an organic light emitting display is a self-luminous display and has low power consumption, high response speed, high luminous efficacy, high brightness, and a wide viewing angle. Recently, multi-functional organic light emitting displays have received attention.

Particularly, a mirror-type organic light emitting display may be used as a display generating an image when the display is driven and may also be used as a mirror when the display is not driven.

SUMMARY

Embodiments relate to an organic light emitting display with a light emitting device disposed in an emission area of a substrate. The light emitting device emits internal light through the emission area of the substrate. The organic light emitting display further includes a light-shielding reflective layer on the substrate overlapping a non-emission area of the substrate to reflect external light incident through the substrate. The organic light emitting display also includes a transistor on the substrate, where an active layer of the transistor overlaps the light-shielding reflective layer.

In one or more embodiments, the organic light emitting display also includes a buffer film on the substrate and the light-shielding reflective layer to cover the light-shielding reflective layer.

In one or more embodiments, the organic light emitting display also includes a pixel circuit driving the light emitting device. The pixel circuit includes a driving thin film transistor connected between the light emitting device and a high voltage supply line. The pixel circuit further includes a switching thin film transistor connected between the driving thin film transistor and a data line. The pixel circuit further includes a storage capacitor connected to the driving thin film transistor and the switching thin film transistor. Active layers of the driving thin film transistor and the switching thin film transistor overlap the light-shielding reflective layer, and the buffer film is interposed between the active layers and the light-shielding reflective layer.

In one or more embodiments, the organic light emitting display further includes a scan line connected to a gate electrode of the switching thin film transistor and a data line connected to a first source electrode of the switching thin film transistor. The high voltage supply line is connected to a second source electrode of the driving thin film transistor. The organic light emitting display also includes a low voltage supply line connected to a cathode of the light emitting device. The light-shielding reflective layer overlaps at least one of the scan line, the data line, the high voltage supply line, and the low voltage supply line.

In one or more embodiments, the organic light emitting display also includes a plurality of pads configured to supply a driving signal to the scan line, the data line, the high voltage supply line, and the low voltage supply line. The light-shielding reflective layer overlaps a pad area of the substrate provided with the plurality of pads.

In one or more embodiments, the storage capacitor includes a storage lower electrode connected to the switching thin film transistor and a storage upper electrode connected to the driving thin film transistor. The storage lower electrode and the storage upper electrode are composed of transparent material and are disposed in the emission area of the substrate.

In one or more embodiments, the storage lower electrode is formed of a same material as the active layers, and the storage upper electrode extends from a transparent conductive layer of a drain electrode of the driving thin film transistor.

In one or more embodiments, the organic light emitting display further comprises a light-shielding pad connected to the light-shielding reflective layer and a flexible printed circuit board film having a signal supply terminal supplying a base voltage or a low voltage to the light-shielding reflective layer.

In one or more embodiments, the light-shielding pad extends from the light-shielding reflective layer and is exposed through a light-shielding contact hole passing through a plurality of insulating films disposed on the light-shielding reflective layer. And the light-shielding pad is connected to the flexible printed circuit board film.

In one or more embodiments, the light-shielding pad includes a light-shielding lower electrode extending from the light-shielding reflective layer, a light-shielding contact hole passing through a plurality of insulating films disposed on the light-shielding lower electrode, and a light-shielding upper electrode connected to the light-shielding lower electrode exposed through the light-shielding contact hole. The light-shielding upper electrode of the light-shielding pad is connected to the flexible printed circuit board film.

In one or more embodiments, the organic light emitting display also includes a conductive film connecting a signal supply terminal of a flexible printed circuit board film to the light-shielding pad.

In one or more embodiments, the light shielding pad is formed of a same material as the light shielding reflective layer.

In one or more embodiments, the light-shielding reflective layer has a single layer structure or a multilayer structure including material selected from a group consisting of Mo, Ti, Al, Cu, Cr, Co, W, Ta, Ni, MoTi, CuNx, and, Cr.

In one or more embodiments, the light-shielding reflective layer is made of Ti having a first thickness of 500 Å to 1000 Å, made of Mo having a second thickness of 300 Å to 700 Å, made of Cu having a third thickness of 700 Å to 2000 Å, made of MoTi having a fourth thickness of 300 Å to 500 Å, or made of Al having a fifth thickness of 500 Å to 2000 Å.

In one or more embodiments, the external light incident through the substrate is reflected by the light-shielding reflective layer at the non-emission area of the substrate. The internal light is generated by the light emitting device and is reflected by a cathode of the light emitting device.

In one or more embodiments, the organic light emitting display further comprises a color filter between the substrate and a light emitting layer.

In one or more embodiments, the non-emission area of the substrate is larger than the emission area of the substrate.

In one or more embodiments, the non-emission area comprises areas other than emission areas of sub-pixels, a non-emission area of a sub-pixel being larger than an emission area of the sub-pixel.

In another embodiment, an organic light emitting display comprises a light emitting device configured to emit light through an emission area of a transparent substrate for displaying an image in a light emission mode. The organic light emitting display further comprises a pixel driving circuit coupled to the light emitting device and configured to drive the light emitting device. The organic light emitting display further comprises a light-shielding reflective layer between the transparent substrate and the pixel driving circuit, where the light-shielding reflective layer is configured to reflect external light passing through the transparent substrate in a mirror mode.

In one or more embodiments, the light emitting device is turned off during the mirror mode.

In one or more embodiments, the organic light emitting display further comprises a buffer film between the light-shielding reflective layer and the pixel driving circuit. The organic light emitting display further comprises a pad on the buffer film and overlapping the light-shielding reflective layer, where the pad includes a first pad electrode and a second pad electrode over the first pad electrode.

In one or more embodiments, the first pad electrode is formed of a same material as gate electrodes of thin film transistors in pixel driving circuit.

In one or more embodiments, the second pad electrode is formed of a same material as source and drain electrodes of thin film transistors in pixel driving circuit.

In one or more embodiments, the pad further comprises a pad cover electrode on the second pad electrode, where the pad cover electrode formed of a same transparent material as an anode of the light emitting device.

In one or more embodiments, the pad is electrically coupled to a cathode of the light emitting device to generate the light emitted by the light emitting device.

BRIEF DESCRIPTION OF THE DRAWINGS

The accompanying drawings, which are included to provide a further understanding of embodiments of the invention and are incorporated in and constitute a part of this application, illustrate embodiments of the invention and together with the description serve to explain the embodiments of the invention. In the drawings.

DETAILED DESCRIPTION

Reference will now be made in detail to embodiments of the present invention, examples of which are illustrated in the accompanying drawings.

Figure 1:
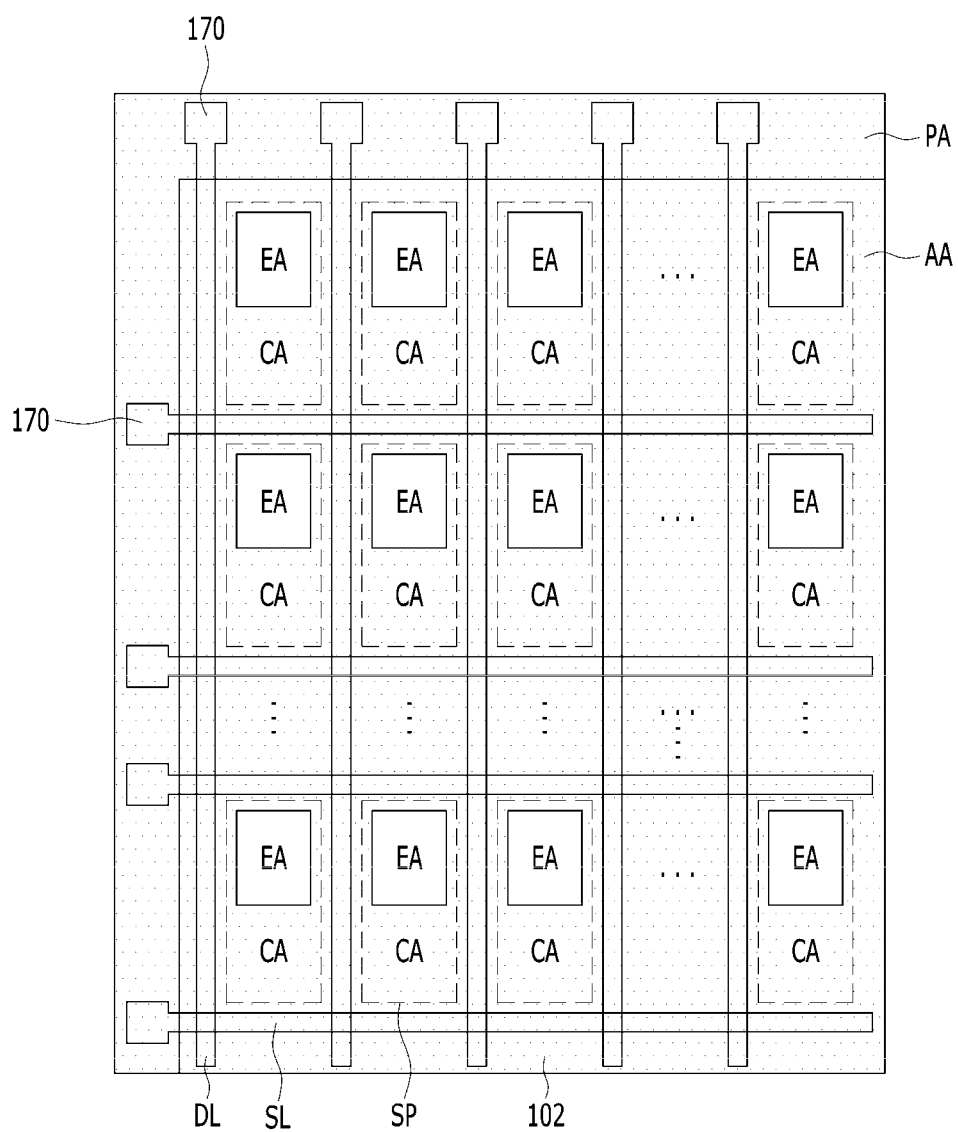
FIG. 1 is a plan view illustrating a mirror-type organic light emitting display in accordance with an embodiment.
Figure 2:
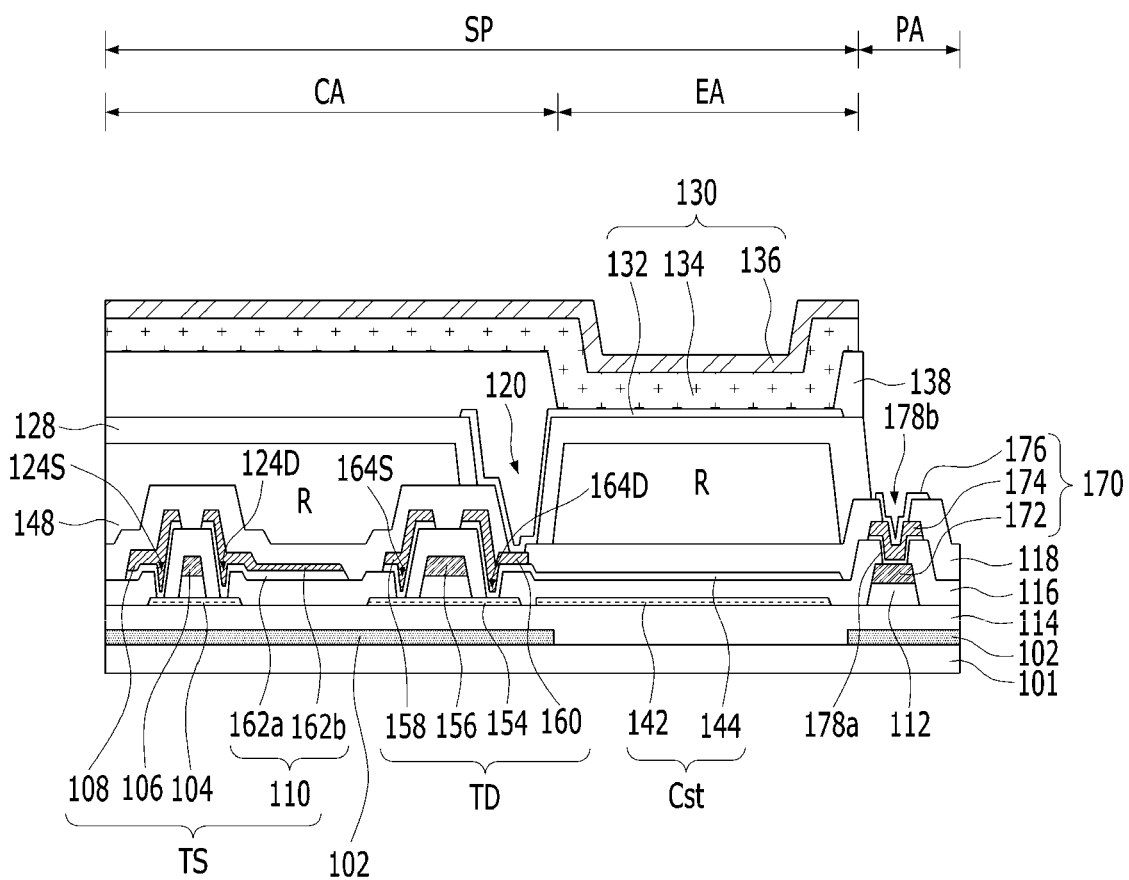
FIG. 2 is a cross-sectional view illustrating the mirror-type organic light emitting display in accordance with an embodiment.

FIG. 1 is a plan view illustrating an organic light emitting display in accordance with an embodiment, and FIG. 2 is a cross-sectional view illustrating the organic light emitting display in accordance with an embodiment.

The organic light emitting display shown in FIGS. 1 and 2 includes an active area AA and a pad area PA.

In the pad area PA, a plurality of pads 170 is formed. The pads 170 supply a driving signal to scan lines SL, data lines DL, a low voltage (VSS) supply line (not shown) and a high voltage (VDD) supply line (not shown), which are located in the active area AA.

In an embodiment, a pad 170 includes a first pad electrode 172, a second pad electrode 174 and a pad cover electrode 176.

The first pad electrode 172 is formed of the same material as gate electrodes 106 and 156, on a gate insulating pattern 112 having the same shape as the first pad electrode 172.

The second pad electrode 174 is conductively connected to the first pad electrode 172 exposed through a first pad contact hole 178a passing through an interlayer insulating film 116. The second pad electrode 174 is formed of the same material as source electrodes 108 and 158, and drain electrodes 110 and 160, on the interlayer insulating film 116, and is coplanar with the source and drain electrodes 108, 158, 110, and 160.

The pad cover electrode 176 is conductively connected to the second pad electrode 174 exposed through a second pad contact hole 178b passing through a protective film 118. Further, the pad cover electrode 176 contacts a flexible printed circuit board film 190 exposed to the outside and provided with a driving integrated circuit mounted thereon, or contacts a flexible printed circuit board film 190 connected to a driving integrated circuit, as shown by the examples in FIGS. 3A and 3B. Here, the pad cover electrode 176 is formed of a metal having high corrosion resistance and high acid resistance on the protective film 118 and, thus, corrosion of the pad cover electrode 176 due to external moisture or other contamination may be prevented even if the pad cover electrode 176 is exposed to the outside. For example, the pad cover electrode 176 may be formed of the same material as an anode 132 and is coplanar with the anode 132. For example, the pad cover electrode 176 is formed of a transparent conductive film having high corrosion resistance and high acid resistance, such as indium-tin-oxide (ITO) or indium-zinc-oxide (IZO).

In the active area, a plurality of sub-pixels SP is arranged in a matrix and thus an image is displayed. The sub-pixels SP include, for example, red sub-pixels SP, green sub-pixels SP, blue sub-pixels SP, and white sub-pixels SP, thus forming unit pixels. The red, green, blue and white sub-pixels SP may be arranged in various configurations in the unit pixels, and the order or arrangement of the red, green, blue and white sub-pixels SP may vary according to color sense or structure. Each of the red, green, blue, and white sub-pixels SP may include a light emitting device 130 disposed in an emission area EA and a pixel driving circuit to independently drive the light emitting device 130.

The pixel driving circuit includes a switching thin film transistor TS, a driving thin film transistor TD, and a storage capacitor Cst. In an embodiment, the switching thin film transistor TS and the driving thin film transistor TD are disposed in a circuit area CA included in a non-emission area (and not included in the emission area EA) of a sub-pixel SP, and the storage capacitor Cst is disposed in the emission area EA of the sub-pixel SP. A non-emission area herein refers to an area other than the emission areas of sub-pixels. Specifically, the non-emission area may include the non-emission areas of sub-pixels as well as areas surrounding the sub-pixels. In an embodiment, the non-emission area (e.g., circuit area CA) is larger than the emission area EA. Specifically, the non-emission area of a pixel may be larger than the emission area EA of the same pixel. Alternatively or in additionally, the overall non-emission area of the display device 100 may be larger than the overall emission area EA of the display device 100.

The switching thin film transistor TS is turned on when a scan pulse is supplied to the scan line SL, and supplies a data signal supplied to the data line DL to the storage capacitor Cst and the gate electrode 156 of the driving thin film transistor TD. The switching thin film transistor Ts includes, as shown in FIG. 2, a first gate electrode 106 connected to the scan line SL, a first source electrode 108 connected to the data line DL, a first drain electrode 110 connected to a second gate electrode 156, and a first active layer 104.

The driving thin film transistor TD controls current supplied from the high voltage (VDD) supply line according to driving voltage charging the storage capacitor Cst and thus supplies current in proportion to the driving voltage to the light emitting device 130, thereby causing the light emitting device 130 to emit light. The driving thin film transistor TD includes the second gate electrode 156 connected to the first drain electrode 110, a second source electrode 158 connected to the high voltage (VDD) supply line, a second drain electrode 160 connected to the light emitting device 130, and a second active layer 154.

The first and second gate electrodes 106 and 156 of the switching thin film transistor TS and the driving thin film transistor TD overlap the first and second active layers 104 and 154, respectively. The gate insulating pattern 112 having the same pattern as the first and second gate electrodes 106 and 156 is interposed between the first and second gate electrodes 106 and 156 and the first and second active layers 104 and 154.

The first and second active layers 104 and 154 overlap the first and second gate electrodes 106 and 156, respectively, where the gate insulating pattern 112 is interposed therebetween, thus forming a first channel region between the first source and drain electrodes 108 and 110 and a second channel region between the second source and drain electrodes 158 and 160. The first and second active layers 104 and 154 are formed of an oxide semiconductor including at least one metal selected from the group consisting of Zn, Cd, Ga, In, Sn, Hf, and Zr, or formed of polycrystalline silicon or amorphous silicon.

The first and second source electrodes 108 and 158 are connected to the first and second active layers 104 and 154, respectively, through first and second source contact holes 124S and 164S formed through the interlayer insulating film 116. The first and second drain electrodes 110 and 160 are connected to the first and second active layers 104 and 154, respectively, through first and second drain contact holes 124D and 164D formed through the interlayer insulating film 116. In an embodiment, each of the first and second source electrodes 108 and 158 and the first and second drain electrodes 110 and 160 has a structure in which a transparent conductive film 162a and an opaque conductive film 162b are sequentially stacked. For example, the transparent conductive film 162a is formed of a material, such as indium-tin-oxide (ITO) or indium-zinc-oxide (IZO), and the opaque conductive film 162b is formed to have a single layer structure or a multilayer structure including Al, Ag, Cu, Pb, Mo, Ti, Ag—Pb—Cu (APC), or an alloy thereof.

The first drain electrode 110 is conductively connected to the second gate electrode 156 of the driving thin film transistor TD. The second drain electrode 160 is exposed through a pixel contact hole 120 formed through the protective film 118 and is thus connected to the anode 132.

A buffer film 114 is formed between the first and second active layers 104 and 154 and a substrate 101. The buffer film 114 has a single layer structure or a multilayer structure formed of silicon oxide or silicon nitride on the substrate 101 formed of glass, a plastic resin, such as polyimide (PI), or another type of transparent material. The buffer film 114 prevents diffusion of moisture or impurities generated by the substrate 101 or adjusts heat transfer speed in crystallization, thus facilitating crystallization of the first and second active layers 104 and 154.

The storage capacitor Cst includes a storage lower electrode 142 and a storage upper electrode 144 which overlap each other with the interlayer insulating film 116 interposed therebetween.

The storage lower electrode 142 is connected to the first drain electrode 110 of the switching thin film transistor TS. The storage lower electrode 142 is formed of the same transparent material as the first and second active layers 104 and 154 of the switching and driving thin film transistors TS and TD, respectively, on the buffer film 114.

The storage upper electrode 144 is connected to the second drain electrode 160 of the driving thin film transistor TD. The storage upper electrode 144 extends from the transparent conductive film 162a of the second drain electrode 160 of the driving thin film transistor TD on the interlayer insulating film 116.

As such, the storage lower electrode 142 and the storage upper electrode 144, which are formed of transparent materials, of the storage capacitor Cst are disposed in the emission area EA and, thus, an opening ratio of the organic light emitting display may be improved.

The light emitting device 130 includes an anode 132 connected to the second drain electrode 160 of the driving thin film transistor TD, at least one light emitting stack 134 formed on the anode 132, and a cathode 136 formed on the light emitting stack 134.

The anode 132 is disposed on a planarization layer 128 and exposed through a bank 138. The anode 132 is conductively connected to the second drain electrode 160 of the driving thin film transistor TD exposed through the pixel contact hole 120. The anode 132 is formed of a transparent conductive film, such as indium-tin-oxide (ITO) or indium-zinc-oxide (IZO), and transmits light generated by the light emitting stack 134 toward the substrate 101.

In an embodiment, the light emitting stack 134 is formed by stacking a hole relating layer, an organic light emitting layer, and an electron relating layer on the anode 132 in order or in reverse order. Further, a first and second light emitting stack may be formed opposite to each other and a charge generation layer (CGL) may be interposed therebetween. In an example case, an organic light emitting layer of one of the first and second light emitting stacks generates blue light, and an organic light emitting layer of the other of the first and second light emitting stacks generates yellow light-green light, thus producing white light through the first and second light emitting stacks.

The bank 138 exposes the anode 132 and thus provides the light emission area EA. The bank 138 may be formed of an opaque material (for example, a black material) to prevent optical interference between neighboring sub-pixels SP. In this case, the bank 138 may be formed of a light-shielding material including at least one of a color pigment, an organic black pigment, and carbon.

The cathode 136 is formed on the upper surfaces and the side surfaces of the light emitting stack 134 and the bank 138. The cathode 136 is also opposite the anode 132, and the light emitting stack 134 is interposed between the anode 132 and the cathode 136. The cathode 136 is formed to have a single layer structure including an opaque conductive film having high reflection coefficient, or is formed to have a multilayer structure including a transparent conductive film and an opaque conductive film having high reflection coefficient. The transparent conductive film may be formed of a material having a comparatively high work function value, such as indium-tin-oxide (ITO) or indium-zinc-oxide (IZO), and the opaque conductive film is formed to have a single layer structure or a multilayer structure including Al, Ag, Cu, Pb, Mo, Ti, Ag—Pb—Cu (APC), or an alloy thereof. For example, the cathode 136 may be formed to have a structure in which a first transparent conductive film, an opaque conductive film, and a second transparent conductive film are sequentially stacked, or a structure in which a transparent conductive film and an opaque conductive film are sequentially stacked. The cathode 136 including an opaque conductive film having high reflection coefficient reflects light generated by the light emitting stack 134 towards the substrate 101.

A color filter 148 is disposed on the protective film 118 to overlap the emission area EA provided by the bank 138. In an embodiment, one of red (R), green (G), and blue (B) color filters 148 is disposed in each of the sub-pixels SP. That is, the red (R) color filter 148 is disposed in the red (R) sub-pixel SP, the green (G) color filter 148 is disposed in the green (G) sub-pixel SP, and the blue (B) color filter 148 is disposed in the blue (B) sub-pixel SP. Therefore, white light generated by the light emitting device 130 passes through the color filter 148, thus producing light of a color corresponding to the color filter 148. The color filter 148 may extend to cover at least one of the switching thin film transistor TS and the driving thin film transistor TD. The color filter 148 may be between the substrate 101 and the light emitting stack 134 (which may also be referred to as a light emitting layer). Thus, the display device 100 may have a bottom emission structure.

In some embodiments, each light emitting stack 134 may produce light of a color corresponding to a sub-pixel SP without the color filter 148. That is, the light emitting stack 134 of the red (R) sub-pixel SP may emit red light, the light emitting stack 134 of the green (G) sub-pixel SP may emit green light, and the light emitting stack 134 of the blue (B) sub-pixel SP may emit blue light.

In order to operate the above-described organic light emitting display in accordance with one embodiment in a mirror mode, a light-shielding reflective layer 102 disposed in the non-emission area (e.g., the circuit area CA), which does not influence an opening ratio, is provided. In one embodiment, the light-shielding reflective layer 102 covers substantially the entire non-emission area.

The light-shielding reflective layer 102 may be formed in the non-emission area, and not in the emission area EA, of each sub-pixel SP. The light-shielding reflective layer 102 overlaps the switching and driving thin film transistors TS and TD disposed in the circuit area CA. Further, the light-shielding reflective layer 102 overlaps the scan line SL, the data line DL, the low voltage (VSS) supply line, the light voltage (VDD) supply lines connected to the switching and driving thin film transistors TS and TD, and the pad area PA in which the pads 170 are formed. Therefore, the light-shielding reflective layer 102 serves to reflect external light incident upon the non-emission area from the outside to operate the organic light emitting display in the mirror mode.

The light-shielding reflective layer 102 is formed on the substrate 101 to overlap the active layers 104 and 154 of the switching and driving thin film transistors TS and TD. The buffer film 114 is interposed between the light-shielding reflective layer 102 and the active layers 104 and 154. Therefore, the light-shielding reflective layer 102 may block external light incident upon the active layers 104 and 154 of the switching and driving thin film transistors TS and TD.

The light-shielding reflective layer 102 is formed of a material in which reflectivity of a lower surface thereof contacting the substrate 101 is higher than reflectivity of an upper surface thereof contacting the buffer film 114, or is formed of a material in which reflectivities of a lower surface thereof contacting the substrate 101 and an upper surface thereof contacting the buffer film 114 are high. The light-shielding reflective layer 102 is formed to have a single layer structure or a multilayer structure including at least one material having high reflectivity selected from the group consisting of Mo, Ti, Al, Cu, Cr, Co, W, Ta, Ni, MoTi, CuNx, and Cr. A thickness of the light-shielding reflective layer 102 based on the material of the light-shielding reflective layer 102.

As stated in Table 1 below, Ti and Mo have reflectivities that increase as the thickness thereof increases from 100 Å to 500 Å and decrease as the thickness thereof increases from 500 Å to 1000 Å. Cu has reflectivity that increases as the thickness thereof increases from 100 Å to 1000 Å and that decreases as the thickness thereof increases from 1000 Å to 2000 Å. ITO/APC/ITO has reflectivity that increases as the thickness of APC increases from 100 Å to 1000 Å under the condition that thickness of ITO is fixed to 100 Å and has a reflectivity of 92% or greater when the thickness of APC is 700 Å or greater. MoTi has reflectivity that increases as the thickness thereof increases from 100 Å to 300 Å and that decreases as the thickness thereof increases from 300 Å to 1000 Å. Al has reflectivity that increases as the thickness thereof increases from 100 Å to 500 Å and that is maintained at least at 92% when the thickness thereof is 500 Å or greater.

TABLE 1

| Material | Thickness [Å] | | | | | | |
|---|---|---|---|---|---|---|---|
| | 100 | 200 | 300 | 500 | 700 | 1000 | 2000 |
| Ti | 16.4 | — | 42.6 | 59.4 | 56.8 | 54.8 | — |
| Mo | 45.5 | — | 62.4 | 60.9 | 57.9 | 57.5 | — |
| ITO/APC/ITO (ITO-100 Å; APC thickness varied) | 48.6 | 56.8 | 72.4 | 87.69 | 92.1 | 93.2 | — |

TABLE 1-continued

| Material | Thickness [Å] | | | | | | |
|---|---|---|---|---|---|---|---|
| | 100 | 200 | 300 | 500 | 700 | 1000 | 2000 |
| Cu | 35.8 | — | 63.5 | 74.4 | 75.5 | 76.5 | 73.9 |
| MoTi | 34.6 | — | 58.1 | 57.5 | 52.7 | 50.8 | — |
| Al | 72.4 | — | 90.1 | 92.0 | 92.1 | 92.1 | 92.0 |

Therefore, the light-shielding reflective layer 102 formed of Ti may be designed to have a thickness of 500 Å to 1000 Å, the light-shielding reflective layer 102 formed of Mo may be designed to have a thickness of 300 Å to 700 Å, the light-shielding reflective layer 102 formed of ITO/APC/ITO may be designed to have a thickness of 700 Å or greater, the light-shielding reflective layer 102 formed of Cu may be designed to have a thickness of 700 Å to 2000 Å, the light-shielding reflective layer 102 formed of MoTi may be designed to have a thickness of 300 Å to 500 Å, and the light-shielding reflective layer 102 formed of Al may be designed to have a thickness of 500 Å or greater.

If the light-shielding reflective layer 102 disposed on the substrate 101 maintains a floating state, the light-shielding reflective layer 102 functions as a floating gate electrode. This causes a body effect that shifts threshold voltage of the switching and driving thin film transistors TS and TD overlapping the light-shielding reflecting layer 102, and thus the switching and driving thin film transistors TS and TD malfunction. Therefore, in some embodiments of the present invention, a voltage level, for example, a base voltage (GND) or low voltage (VSS), is supplied to the light-shielding reflective layer 102. The light-shielding reflective layer 102 does not function as a floating gate electrode, thus preventing malfunction of the switching and driving thin film transistors TS and TD. If the light-shielding reflective layer 102 is connected to the electrode of at least one of the switching and driving thin film transistors TS and TD, the switching and driving thin film transistors TS and TD may be short-circuited through the light-shielding reflective layer 102, which may be formed in all areas except for the emission area EA. Therefore, the light-shielding reflective layer 102 of the organic light emitting display in accordance with an embodiment of the present invention may not be connected to any one of the switching and driving thin film transistors TS and TD.

Figure 3A:
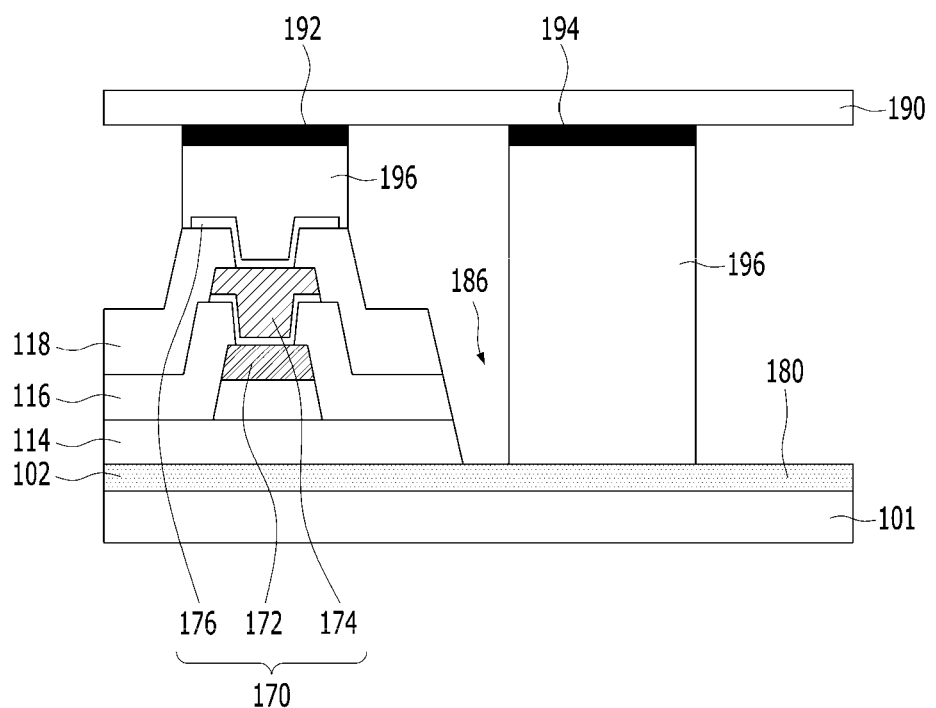
FIGS. 3A and 3B are cross-sectional views each illustrating an embodiment of light-shielding pads connected to a light-shielding reflective layer shown in FIG. 2.
Figure 3B:
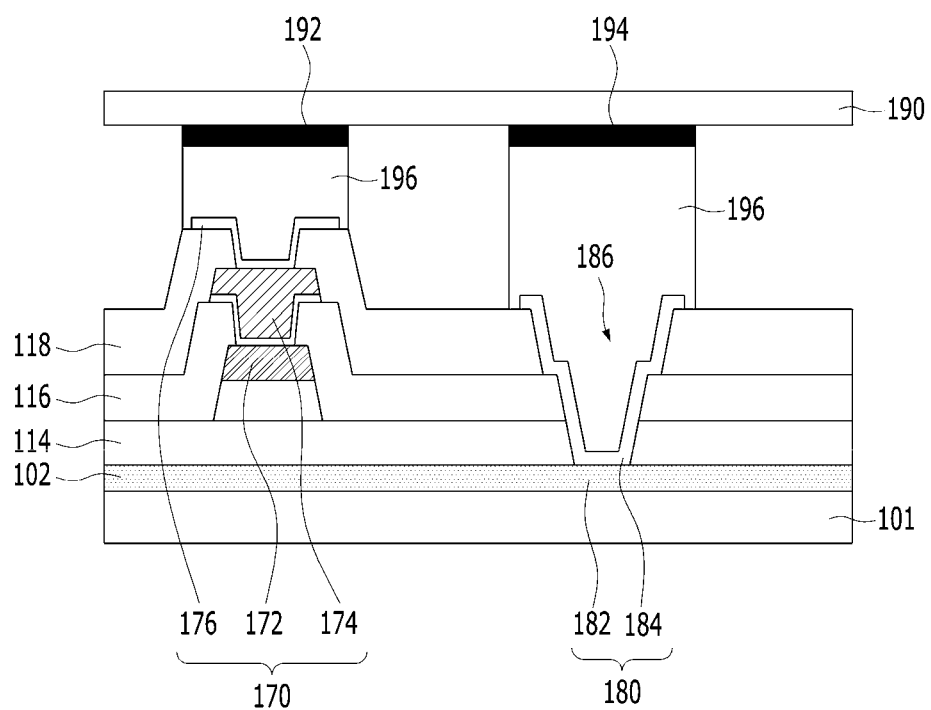

In order to supply base voltage (GND) or low voltage (VSS), e.g., from electrodes of the pads 170, to the light-shielding reflective layer 102, a light-shielding pad 180 connected to the light-shielding reflective layer 102 is provided, as shown by the examples in FIGS. 3A and 3B.

A light-shielding pad 180 of the embodiment shown in FIG. 3A extends from the light-shielding reflective layer 102 and is formed through the same mask process as the light-shielding reflective layer 102. Therefore, the light-shielding pad 180 is formed of the same material as the light-shielding reflective layer 102, on the substrate 101, to be coplanar with the light-shielding reflective layer 102. The light-shielding pad 180 is exposed through a light-shielding contact hole 186 passing through the buffer film 114, the interlayer insulating film 116 and the protective film 118.

A light-shielding pad 180 of the embodiment shown in FIG. 3B includes a light-shielding lower electrode 182 and a light-shielding upper electrode 184. The light-shielding lower electrode 182 extends from the light-shielding reflective layer 102 and is formed through the same mask process as the light-shielding reflective layer 102. Therefore, the light-shielding lower electrode 182 is formed of the same material as the light-shielding reflective layer 102, on the substrate 101, to be coplanar with the light-shielding reflective layer 102. The light-shielding upper electrode 184 is formed through the same mask process as the pad cover electrode 176. Therefore, the light-shielding upper electrode 184 is formed of the same material as the pad cover electrode 176, on the protective film 118, to be coplanar with the pad cover electrode 176, though not necessarily formed at a same distance from the substrate 101. The light-shielding upper electrode 184 is connected to the light-shielding lower electrode 182 exposed through a light-shielding contact hole 186 passing through the buffer film 114, the interlayer insulating film 116, and the protective film 118.

The light-shielding pad 180 shown in FIG. 3A or 3B is connected to the flexible printed circuit board film 190 having a signal supply terminal 194 supplying a voltage level, for example, dropping a base voltage (GND) or low voltage (VSS), through a conductive film 196. The signal supply terminal 194 may be made of a metal material and transmit signals to and from the flexible printed circuit board film 190. The signal supply terminal 194 may be connected to the conductive film 196 via a conductive adhesive such as anisotropic conductive film (ACF). That is, as shown in FIG. 3A, the light-shielding pad 180 exposed through the light-shielding contact hole 186 is connected to the flexible printed circuit board film 190 through the conductive film 196. Further, as shown in FIG. 3B, the light-shielding upper electrode 184 of the light-shielding pad 180 connected to the light-shielding lower electrode 182 through the light-shielding contact hole 186 is connected to the flexible printed circuit board film 190 through the conductive film 196.

Here, the flexible printed circuit board film 190 may be a circuit transmission film on which a signal supply terminal 192 connected to the pad cover electrode 176 is formed, or be provided separately from the circuit transmission film on which the signal supply terminal 192 connected to the pad cover electrode 176 is formed. Thus, a pad 170 may be electrically coupled to the light-shielding reflective layer 102 to provide a voltage level, for example, dropping a base voltage (GND) or a low voltage (VSS), to the light-shielding reflective layer 102 to prevent malfunction of the switching and driving thin film transistors TS and TD. A voltage level may also be provided from the pad 170 to the cathode 136 of the light emitting device 130 for generating emitted internal light.

Figure 4A:
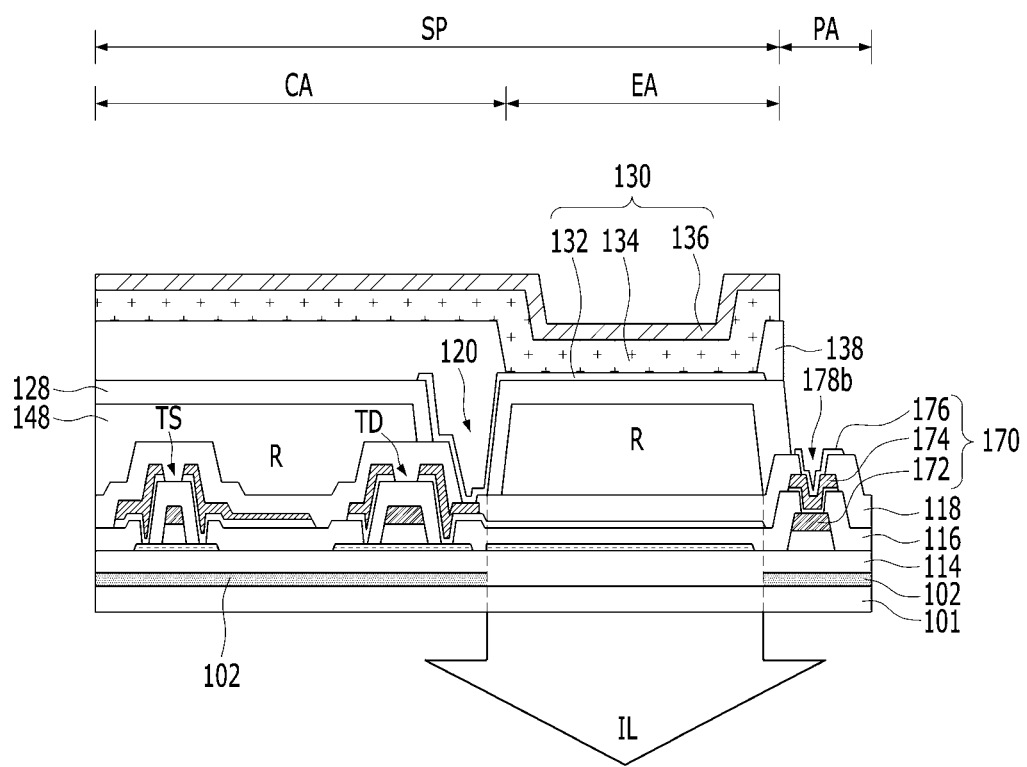
FIGS. 4A and 4B are cross-sectional views illustrating a light emission mode and a mirror mode of the mirror-type organic light emitting display shown in FIG. 2 in accordance with an embodiment.
Figure 4B:
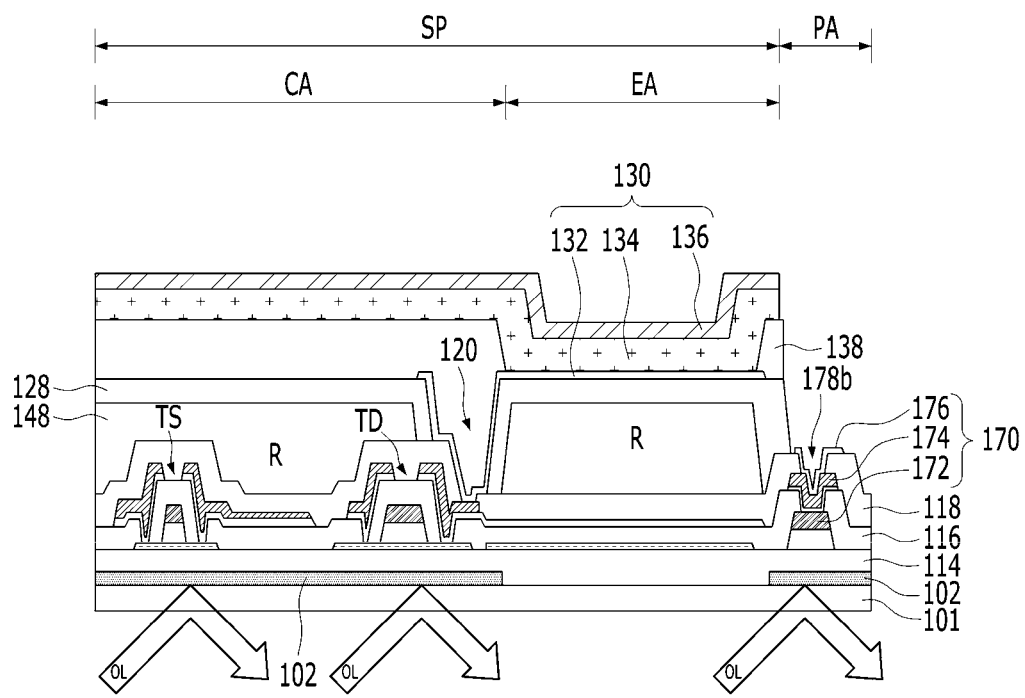

The above-described mirror-type organic light emitting display in accordance with an embodiment of the present invention may be operated in a light emission mode in which a mirror-type organic light emitting display panel is operated to display an image, as shown in FIG. 4A, and may also be operated in a mirror mode in which the mirror-type organic light emitting display panel is operated to implement a mirror function instead of displaying an image, as shown in FIG. 4B. In some embodiments, the mirror-type organic light emitting display panel may be operated to display an image and implement a mirror function simultaneously for a period of time. In other embodiments, the light emitting device is turned off during the mirror mode.

If the organic light emitting display is operated in the light emission mode, the light emitting stack 134 between the cathode 136 and the anode 132 of the organic light emitting device emits light. Here, internal light IL generated by the light emitting stack 134 is emitted toward the light emission area EA on the rear surface of the substrate 101, corresponding to a viewing surface, by the cathode 136 serving as a reflective electrode, thus displaying an image.

If the organic light emitting display is operated in the mirror mode, power of the organic light emitting display panel is in an off state and the light emission area EA is in a black state. Therefore, external light OL is reflected by the light-shielding reflective layer 102 formed in the non-emission area, as shown in FIG. 4B, and thus the organic light emitting display serves as a mirror.

As such, in the organic light emitting display in accordance with an embodiment of the present invention, the light-shielding reflective layer 102 preventing external light from entering the channel regions of the active layers 104 and 154 may be formed in all areas except for the emission areas EA. Therefore, when the organic light emitting display in accordance with an embodiment of the present invention is in a non-operated state, the light-shielding reflective layer 102 serves as a mirror, and thus the organic light emitting display may be stably implemented as a mirror-type display.

Further, the organic light emitting display in accordance with an embodiment of the present invention is implemented as a mirror-type display through a rear surface emission structure (e.g., internal light is emitted through the emission areas of the substrate and through other transparent layers such as the buffer film 114 in between the light emitting stacks 134 and the substrate 101), and thus does not require a separate upper plate structure provided with a reflective layer formed thereon, as compared to a case using a front surface emission structure, and does not require a polarizing plate to implement the mirror mode. Therefore, the organic light emitting display in accordance with an embodiment of the present invention does not require a process of bonding a conventional front surface emission-type display panel and an upper plate structure provided with a reflective layer formed thereon, and also does not require a process of attaching a polarizing plate to the display panel. Thus, the organic light emitting display may have both a simplified structure and a manufacturing process, which may improve productivity.

FIGS. 5A to 5I are cross-sectional views illustrating a method of manufacturing the embodiment of the mirror-type organic light emitting display shown in FIG. 2.

Figure 5A:
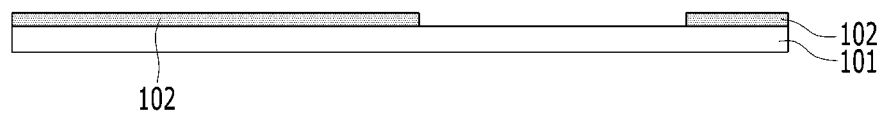
FIGS. 5A to 5I are cross-sectional views illustrating a method of manufacturing the mirror-type organic light emitting display shown in FIG. 2 in accordance with an embodiment.

With reference to FIG. 5A, a light-shielding reflective layer 102 is formed on a substrate 101.

In more detail, a first conductive layer having reflection properties is formed on the substrate 101 through a deposition process. Thereafter, the first conductive layer is patterned through a photolithography process and an etching process, thus forming the light-shielding reflective layer 102.

Figure 5B:
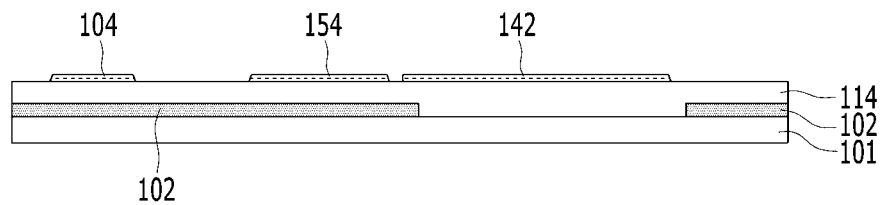

With reference to FIG. 5B, a buffer film 114 is formed on the substrate 101 provided with the light-shielding reflective layer 102, and first and second active layers 104 and 154 and a storage lower electrode 142 are formed on the buffer film 114.

In more detail, the buffer film 114 having a single layer structure or a multilayer structure is formed by depositing an inorganic insulating material, such as $SiO_x$ or $SiN_x$, on a portion of or the entire surface of the substrate 101 provided with the light-shielding reflective layer 102. Thereafter, a semiconductor layer is deposited on the buffer film 114 on the substrate 101 and is then patterned through a photolithography process and an etching process, thus forming the first and second active layers 104 and 154 and the storage lower electrode 142.

Figure 5C:
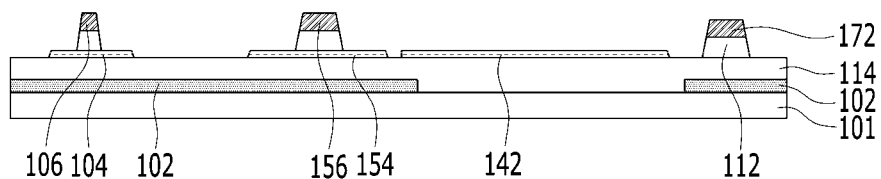

With reference to FIG. 5C, a gate insulating pattern 112 is formed on the buffer film 114 provided with the first and second active layers 104 and 154 and the storage lower electrode 142, and first and second gate electrodes 106 and 156 and a first pad electrode 172 are formed on the gate insulating pattern 112.

In more detail, a gate insulating film is formed on the buffer film 114 provided with the first and second active layers 104 and 154 and the storage lower electrode 142, and a second conductive layer is formed thereon through a deposition method, such as sputtering. An inorganic insulating material, such as $SiO_x$ or $SiN_x$, is used as the gate insulating film. The second conductive layer is formed to have a single layer structure including a metal selected from the group consisting of Mo, Ti, Cu, AlNd, Al, Cr, and an alloy thereof or to have a multilayer structure including the same metal. Thereafter, the second conductive layer and the gate insulating film are simultaneously patterned through a photolithography process and an etching process, thereby forming the first and second gate electrodes 106 and 156 and the first pad electrode 172 and forming the gate insulating pattern 112 thereunder.

Figure 5D:
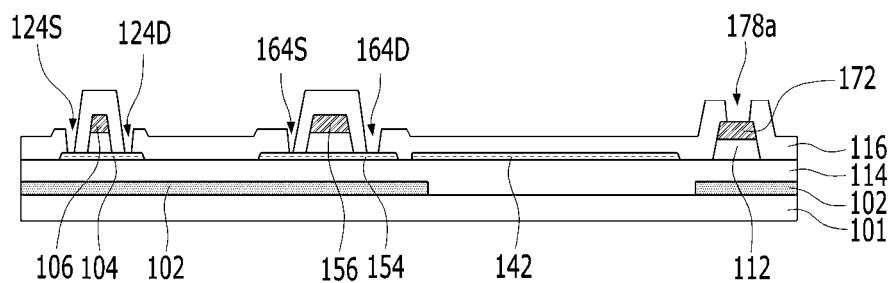

With reference to FIG. 5D, an interlayer insulating film 116 having source and drain contact holes 124S, 124D, 164S, and 164D, and a first pad contact hole 178a is formed on the substrate 101 provided with the first and second gate electrodes 106 and 156 and the first pad electrode 172.

In more detail, the interlayer insulating film 116 is formed on the substrate 101 provided with the first and second gate electrodes 106 and 156 and the first pad electrode 172 through a deposition method, such as plasma-enhanced chemical vapor deposition (PECVD). Thereafter, the interlayer insulating film 116 and the buffer film 104 are selectively patterned through a photolithography process and an etching process, thus forming the source and drain contact holes 124S, 124D, 164S, and 164D, and the first pad contact hole 178a. The source and drain contact holes 124S, 124D, 164S and 164D, and the first pad contact hole 178a are formed through the interlayer insulating film 116, thus exposing at least a portion of the first and second active layers 104 and 154 and the first pad electrode 172.

Figure 5E:
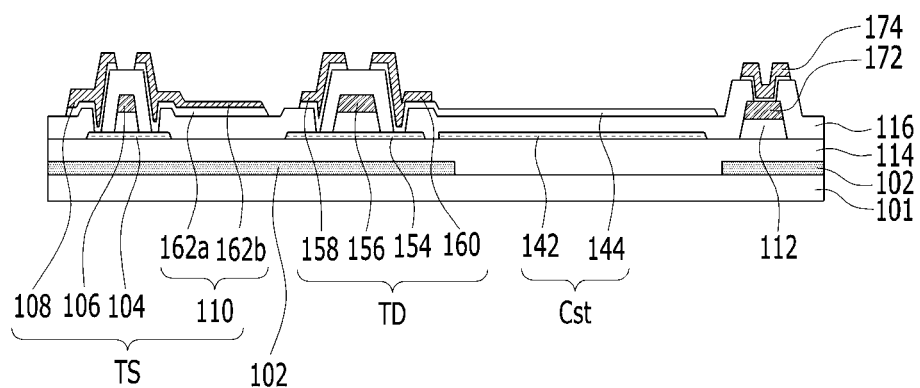

With reference to FIG. 5E, first and second source electrodes 108 and 158, first and second drain electrodes 110 and 160, a storage upper electrode 144, and a second pad electrode 174 are formed on the interlayer insulating film 116 provided with the source and drain contact holes 124S, 124D, 164S, and 164D, and the first pad contact hole 178a.

In more detail, a third conductive film is formed on the interlayer insulating film 116 through a deposition method, such as sputtering. The third conductive layer is formed to have a single layer structure including a metal selected from the group consisting of Mo, Ti, Cu, AlNd, Al, Cr, and an alloy thereof or to have a multilayer structure including the same metal. Thereafter, the third conductive layer is patterned through a photolithography process and an etching process, thus forming the first and second source electrodes 108 and 158, the first and second drain electrodes 110 and 160, the storage upper electrode 144, and the second pad electrode 174 on the interlayer insulating film 116.

Figure 5F:
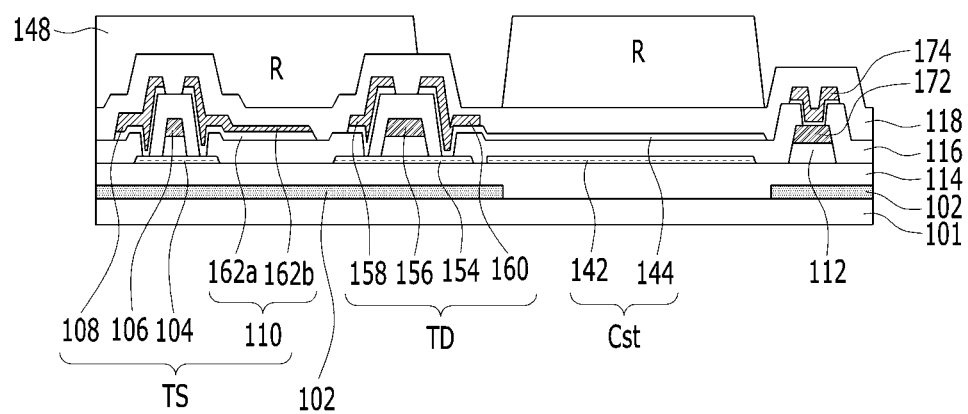

With reference to FIG. 5F, a protective film 118 is formed on the substrate 101 provided with the first and second source electrodes 108 and 158, the first and second drain electrodes 110 and 160, the storage upper electrode 144, and the second pad electrode 174, and a color filter 148 is formed on the protective film 118.

In more detail, an inorganic insulating material, such as $SiO_x$ or $SiN_x$, is deposited on a portion of or the entire surface of the substrate 101 provided with the first and second source electrodes 108 and 158, the first and second drain electrodes 110 and 160, the storage upper electrode 144, and the second pad electrode 174, thus forming the protective film 118. Thereafter, a color resin is applied to the protective film 118 and is then patterned through a photolithography process, thus forming the color filter 148.

Figure 5G:
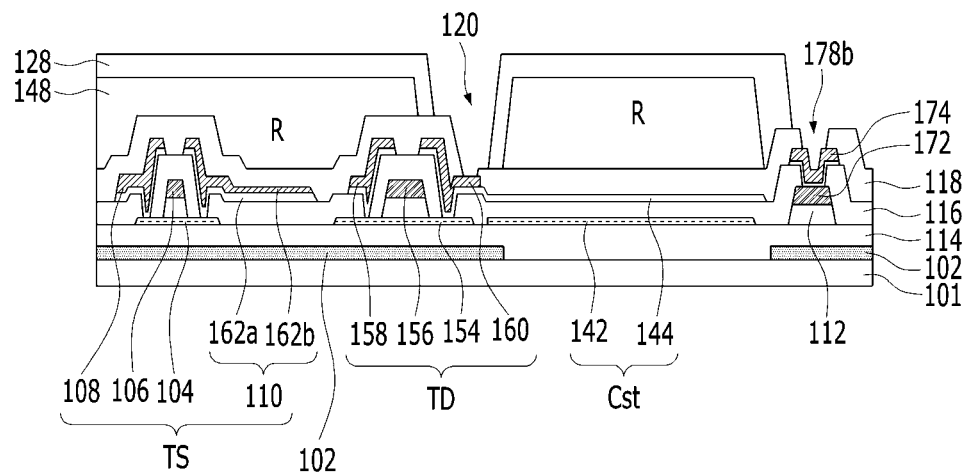

With reference to FIG. 5G, a planarization layer 128 having a pixel contact hole 120 and a second pad contact hole 178b is formed on the substrate 101 provided with the color filter 148.

In more detail, an organic film, such as photo acrylic resin, is applied to a portion of or the entire surface of the substrate 101 provided with the color filter 148, thus forming the planarization layer 128. Thereafter, the planarization layer 128 and the protective film 118 are patterned through a photolithography process and an etching process, thus forming the pixel contact hole 120 and the second pad contact hole 178b.

Figure 5H:
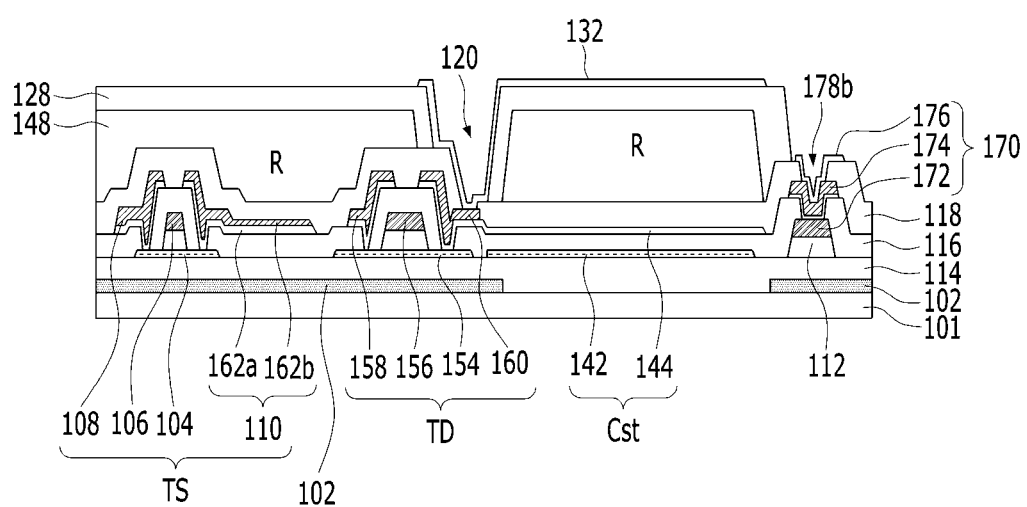

With reference to FIG. 5H, an anode 132 and a pad cover electrode 176 are formed on the substrate 101 provided with the planarization layer 128 having the pixel contact hole 120 and the second pad contact hole 178b.

In more detail, a fourth conductive layer is deposited on a portion of or the entire surface of the substrate 101 provided with the planarization layer 128 having the pixel contact hole 120 and the second pad contact hole 178b. A transparent conductive film may be used as the fourth conductive layer. Thereafter, the fourth conductive layer is patterned through a photolithography process and an etching process, thus forming the anode 132 and the pad cover electrode 176.

Figure 5I:
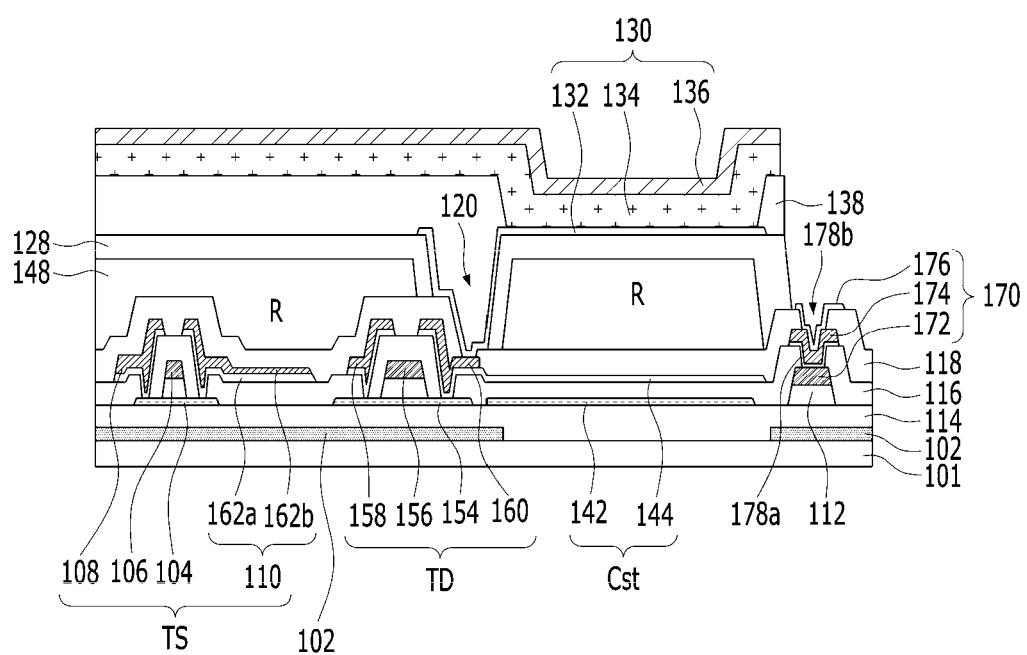

With reference to FIG. 5I, a bank 138 is formed on the substrate 101 provided with the anode 132 and the pad cover electrode 176, and then an organic light emitting stack 134 and a cathode 136 are sequentially formed thereon.

In more detail, a photosensitive organic film is applied to a portion of or the entire surface of the substrate 101 provided with the anode 132 and the pad cover electrode 176 and is then patterned through a photolithography process, thus forming the bank 138. The light emitting stack 134, which may emit white light, and the cathode 136 are sequentially formed on the substrate 101 provided with the bank 138 through a deposition process using a shadow mask.

Although each pixel driving circuit may include the switching thin film transistor TS and the driving thin film transistor TD in the embodiments described above, each pixel driving circuit may further include a sensing thin film transistor which senses threshold voltage of a driving thin film transistor TD or a switching thin film transistor TS. The sensing thin film transistor is connected between a source electrode of the driving transistor TD and a reference line. The sensing thin film transistor supplies, to the source electrode of the driving thin film transistor TD, a reference voltage supplied to the reference line. A threshold voltage of the driving thin film transistor TD is sensed via the sensing thin film transistor, and the data voltage is compensated in proportion to a difference between the sensed threshold voltage and a reference threshold voltage.

As apparent from the above description, in an organic light emitting display in accordance with an embodiment of the present invention, a light-shielding reflective layer preventing external light from entering channel regions is formed in all areas except for emission areas and serves as a mirror when the organic light emitting display is in a non-operated state, and thus the organic light emitting display may be stably implemented as a mirror-type display.

Further, the organic light emitting display in accordance with an embodiment of the present invention is implemented as a mirror-type display using a rear surface emission structure, and thus does not require a separate upper plate structure provided with a reflective layer formed thereon, as compared to other displays in which a front surface emission structure is used. Therefore, the organic light emitting display in accordance with an embodiment of the present invention may simplify a structure and a manufacturing process thereof and thus improve productivity.

It will be apparent to those skilled in the art that various modifications and variations can be made to embodiments of the present invention without departing from the spirit or scope of the embodiments. Thus, it is intended that embodiments of the present invention cover the modifications and variations provided that they come within the scope of the appended claims and their equivalents.

What is claimed is:

1. An organic light emitting display comprising:
a light emitting device disposed in an emission area of a substrate, the light emitting device emitting internal light through the emission area of the substrate;
a light-shielding reflective layer on the substrate overlapping a non-emission area of the substrate to reflect external light incident through the substrate;
a plurality of thin film transistors on the substrate, the plurality of thin film transistors overlapping the light-shielding reflective layer, wherein the light-shielding reflective layer overlaps an area between the plurality of thin film transistors; and
a plurality of pads on the substrate, wherein the light-shielding reflective layer overlaps the plurality of pads and an area between the plurality of pads.

2. The organic light emitting display according to claim 1, further comprising a buffer film on the substrate and the light-shielding reflective layer to cover the light-shielding reflective layer.

3. The organic light emitting display according to claim 2, further comprising a pixel circuit configured to drive the light emitting device,
wherein the pixel circuit includes:
the plurality of thin film transistors including a driving thin film transistor connected between the light emitting device and a high voltage supply line and a switching thin film transistor connected between the driving thin film transistor and a data line; and
a storage capacitor connected to the driving thin film transistor and the switching thin film transistor,
wherein active layers of the driving thin film transistor and the switching thin film transistor overlap the light-shielding reflective layer, the buffer film interposed between the active layers and the light-shielding reflective layer.

4. The organic light emitting display according to claim 3, further comprising:
a scan line connected to a gate electrode of the switching thin film transistor;
a data line connected to a first source electrode of the switching thin film transistor;
the high voltage supply line connected to a second source electrode of the driving thin film transistor; and
a low voltage supply line connected to a cathode of the light emitting device,
wherein the light-shielding reflective layer overlaps at least one of the scan line, the data line, the high voltage supply line, and the low voltage supply line.

5. The organic light emitting display according to claim 4, further comprising the plurality of pads configured to supply a driving signal to the scan line, the data line, the high voltage supply line, and the low voltage supply line,
wherein the light-shielding reflective layer overlaps all pad area of the substrate provided with the plurality of pads.

6. The organic light emitting display according to claim 3, wherein the storage capacitor includes:
a storage lower electrode connected to the switching thin film transistor; and
a storage upper electrode connected to the driving thin film transistor,
wherein the storage lower electrode and the storage upper electrode are composed of transparent material and are disposed in the emission area of the substrate.

7. The organic light emitting display according to claim 6, wherein the storage lower electrode is formed of a same material as the active layers, and
wherein the storage upper electrode extends from a transparent conductive layer of a drain electrode of the driving thin film transistor.

8. The organic light emitting display according to claim 1, further comprising:
a light-shielding pad connected to the light-shielding reflective layer; and
a flexible printed circuit board film having a signal supply terminal supplying a base voltage or a low voltage to the light-shielding reflective layer.

9. The organic light emitting display according to claim 8, wherein:
the light-shielding pad extends from the light-shielding reflective layer and is exposed through a light-shielding contact hole passing through a plurality of insulating films disposed on the light-shielding reflective layer; and
the light-shielding pad is connected to the flexible printed circuit board film.

10. The organic light emitting display according to claim 8, wherein the light-shielding pad includes:
a light-shielding lower electrode extending from the light-shielding reflective layer;
a light-shielding contact hole passing through a plurality of insulating films disposed on the light-shielding lower electrode; and
a light-shielding upper electrode connected to the light-shielding lower electrode exposed through the light-shielding contact hole,
wherein the light-shielding upper electrode of the light-shielding pad is connected to the flexible printed circuit board film.

11. The organic light emitting display according to claim 8, further comprising:
a conductive film connecting a signal supply terminal of a flexible printed circuit board film to the light-shielding pad.

12. The organic light emitting display according to claim 8, wherein the light shielding pad is formed of a same material as the light shielding reflective layer.

13. The organic light emitting display according to claim 1, wherein the light-shielding reflective layer has a single layer structure or a multilayer structure including material selected from a group consisting of Mo, Ti, Al, Cu, Cr, Co, W, Ta, Ni, MoTi, CuNx, and, Cr.

14. The organic light emitting display according to claim 13, wherein the light-shielding reflective layer has a multilayer structure,
wherein the light-shielding reflective layer made of Ti has a first thickness of 500 Å to 1000 Å,
wherein the light-shielding reflective layer made of Mo has a second thickness of 300 Å to 700 Å,
wherein the light-shielding reflective layer made of Cu has a third thickness of 700 Å to 2000 Å,
wherein the light-shielding reflective layer made of MoTi has a fourth thickness of 300 Å to 500 Å, and
wherein the light-shielding reflective layer made of Al has a fifth thickness of 500 Å to 2000 Å.

15. The organic light emitting display according to claim 1, wherein:
the external light incident through the substrate is reflected by the light-shielding reflective layer at the non-emission area of the substrate; and
the internal light is generated by the light emitting device and is reflected by a cathode of the light emitting device.

16. The organic light emitting display according to claim 1, further comprising a color filter between the substrate and a light emitting layer.

17. The organic light emitting display according to claim 1, wherein the non-emission area of the substrate is larger than the emission area of the substrate.

18. The organic light emitting display according to claim 1, wherein the non-emission area comprises areas other than emission areas of sub-pixels, a non-emission area of a sub-pixel being larger than an emission area of the sub-pixel.

19. The organic light emitting display according to claim 1, wherein the light-shielding reflective layer is disposed in all non-emission areas except for the emission area of the substrate.

20. An organic light emitting display comprising:
a light emitting device configured to emit light through an emission area of a transparent substrate for displaying an image in a light emission mode;
a pixel driving circuit coupled to the light emitting device and configured to drive the light emitting device, wherein the pixel driving circuit comprises a plurality of thin film transistors;
a light-shielding reflective layer between the transparent substrate and the pixel driving circuit, the light-shielding reflective layer configured to reflect external light passing through the transparent substrate in a mirror mode, wherein the light-shielding reflective layer overlaps an area between the plurality of thin film transistors; and
a plurality of pads on the transparent substrate, wherein the light-shielding reflective layer overlaps the plurality of pads and an area between the plurality of pads.

21. The organic light emitting display of claim 20, wherein the light emitting device is turned off during the mirror mode.

22. The organic light emitting display according to claim 20, wherein the plurality of thin film transistors comprises:
a driving thin film transistor having a terminal connected to the light emitting device to provide current to the light emitting device, and
a switching thin film transistor between a data line and the driving thin transistor to provide a data signal to the driving thin transistor, the light-shielding reflective layer spanning across the driving thin film transistor and the switching thin film transistor.

23. The organic light emitting display according to claim 20, further comprising:
a buffer film between the light-shielding reflective layer and the pixel driving circuit; and a pad on the buffer film and overlapping the light-shielding reflective layer, the pad including a first pad electrode and a second pad electrode over the first pad electrode.

24. The organic light emitting display according to claim 23, wherein the first pad electrode is formed of a same material as gate electrodes of thin film transistors in pixel driving circuit.

25. The organic light emitting display according to claim 23, wherein the second pad electrode is formed of a same material as source and drain electrodes of thin film transistors in pixel driving circuit.

26. The organic light emitting display according to claim 23, wherein the pad further comprises a pad cover electrode on the second pad electrode, the pad cover electrode formed of a same transparent material as an anode of the light emitting device.

27. The organic light emitting display according to claim 23, wherein the pad is electrically coupled to a cathode of the light emitting device to generate the light emitted by the light emitting device.

28. The organic light emitting display according to claim 20, wherein a non-emission area of the transparent substrate is larger than the emission area of the transparent substrate.

29. The organic light emitting display according to claim 20, wherein a non-emission area comprises areas other than emission areas of sub-pixels, a non-emission area of a sub-pixel being larger than an emission area of the sub-pixel.

30. The organic light emitting display according to claim 20, further comprising a color filter between the transparent substrate and a light emitting layer.

\* \* \* \* \*